(12) United States Patent
Lee et al.

(10) Patent No.: US 7,501,652 B2
(45) Date of Patent: Mar. 10, 2009

(54) THIN FILM TRANSISTOR STRUCTURE AND MANUFACTURING METHOD THEREOF

(75) Inventors: Yu-Chou Lee, Shu-Lin (TW); Tsung-Chi Cheng, Taichung (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 633 days.

(21) Appl. No.: 10/611,896

(22) Filed: Jul. 3, 2003

(65) Prior Publication Data

US 2004/0046172 A1    Mar. 11, 2004

(30) Foreign Application Priority Data

Sep. 9, 2002    (TW) .............................. 091120511 A

(51) Int. Cl.
*H01L 29/04*    (2006.01)
*H01L 31/036*    (2006.01)
*H01L 31/0376*    (2006.01)
*H01L 31/20*    (2006.01)

(52) U.S. Cl. .............................. 257/52; 257/57; 257/59; 257/60; 257/61; 257/72

(58) Field of Classification Search .................... 257/52, 257/57, 59–61, 72
See application file for complete search history.

(56) References Cited

U.S. PATENT DOCUMENTS

| 5,416,341 | A | * | 5/1995 | Hayama | ....................... 257/59 |
| 5,995,187 | A | * | 11/1999 | Wakagi et al. | .............. 349/141 |
| 6,317,185 | B1 | * | 11/2001 | Harano et al. | ................ 349/147 |
| 6,376,861 | B1 | * | 4/2002 | Yaegashi et al. | ............... 257/59 |
| 2002/0176032 | A1 | * | 11/2002 | Maeda et al. | ................. 349/43 |

FOREIGN PATENT DOCUMENTS

| JP | 2000-194012 | 7/2000 |
| JP | 2000-314897 | 11/2000 |

* cited by examiner

*Primary Examiner*—Thien F. Tran
(74) *Attorney, Agent, or Firm*—Rosenberg, Klein & Lee

(57) ABSTRACT

A thin film transistor source/drain structure and the manufacturing method thereof are disclosed. The thin film transistor source/drain structure uses a sandwich structure to reduce the resistivity of the source/drain and upgrade the reliability. The sandwich structure preferably comprises a structure of AlNdN alloy/AlNd alloy/AlNdN alloy. The AlNdN alloy is used as a buffer layer or a diffusion barrier to prevent the AlNd alloy and an amorphous silicon layer from diffusing into each other. The other AlNdN alloy is used as a glue layer and to protect the AlNd alloy from being over-etched. The other AlNdN alloy can also prevent the AlNd alloy and the following formed ITO from contact and interaction.

13 Claims, 2 Drawing Sheets

THIN FILM TRANSISTOR STRUCTURE AND MANUFACTURING METHOD THEREOF

BACKGROUND OF THE INVENTION

1. Field of the Invention

The present invention relates to a thin film transistor structure and the manufacturing method thereof, and more particularly to a thin film transistor source/drain structure and the manufacturing method thereof.

2. Description of the Related Art

The demand for smaller electronic consumer products with higher resolution displays, spurs continued research and development in the area of liquid crystal displays (LCDs). The size of LCDs can be controlled by incorporating the large-scale integration (LSI) and very large scale integration (VLSI) driver circuits, presently on the periphery of LCDs, into the LCD itself. The elimination of externally located driving circuits and transistors will reduce product size, process complexity, a number of process steps, and ultimately the price of the product in which the LCD is mounted.

The primary component of the LCD, and the component that must be enhanced for further LCD improvements to occur, is the thin-film transistor (TFT). TFTs are typically fabricated on a transparent substrate such as quartz, glass, or even plastic. TFTs are almost exclusively used as switches to allow the various pixels of the LCD to be charged in response to the driver circuits. TFT performance will be improved, and driver circuit functions incorporated into TFTs, by increasing the electron mobility in the TFT devices. Increasing the electron mobility of a transistor results in a transistor having faster switching speeds. Improved TFTs having increased electron mobility yield controllable LCD screens, lower power consumption, and faster transistor response times. Further LCD resolution enhancements will require that the TFTs mounted on the transparent substrates have electron mobility characteristics rivaling IC driver circuits currently mounted along the edges of the screen. That is, display and driver TFT located across the entire display must operate at substantially the same level of performance.

RC(Resistance and Capacitance)time delay of TFTs of large-size and high resolution LCD is crucial factor since large RC delay would drags switching speed of TFTs. That is, the resistance or capacitance of TFTs must be further decreased. Due to the characteristic properties of TFTs processes, the materials and processes of source and drain of TFTs are much more critical than those of conventional transistors of integrated circuits. Moreover, the materials of source and drain of conventional TFTs can not satisfy the requirements of large-size and high resolution LCD. For example, the conventional material of source and drain of TFTs is chrome which has resistivity about 18 µΩ and such high resistivity will not meet the requirements of modern large-size and high resolution LCDs.

In view of the drawbacks mentioned with the prior art source and drain structure and process thereof, there is a continued need to develop new and improved structures and processes that overcome the disadvantages associated with prior art structures and processes. The advantages of this invention are that it solves the problems mentioned above.

SUMMARY OF THE INVENTION

It is therefore an object of the invention to provide a thin-film transistor with source and drain having a low resistivity and a sandwich structure.

It is another object of this invention to provide a new and reliable source and drain structure of a thin-film transistor.

It is another object of this invention to provide a low cost and high efficient thin-film transistor source and drain structure and manufacturing method thereof.

To achieve these objects, and in accordance with the purpose of the invention, the invention provides a thin film transistor structure and the manufacturing method thereof. The thin-film transistor structure comprises an insulating substrate, a gate electrode on the insulating substrate, a dielectric layer over the gate electrode, a first semiconductive layer on the dielectric layer, a second semiconductive layer on the first semiconductive layer, a first conductive layer on the second semiconductive layer, a second conductive layer used as a source and a drain on the first conductive layer, a third conductive layer on the second conductive layer, and an opening through the second semiconductive layer, the first conductive layer, the second conductive layer and the third conductive layer and exposing the first semiconductive layer.

It is to be understood that both the foregoing general description and the following detailed description are exemplary and explanatory only and are not restrictive of the invention, as claimed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

It is to be understood and appreciated that the process steps and structures described below do not cover a complete process flow. The present invention can be practiced in conjunction with various fabrication techniques that are used in the art, and only so much of the commonly practiced process steps are included herein as are necessary to provide an understanding of the present invention.

The present invention will be described in detail with reference to the accompanying drawings. It should be noted that the drawings are in greatly simplified form and they are not drawn to scale. Moreover, dimensions have been exaggerated in order to provide a clear illustration and understanding of the present invention.

Figure 1A:
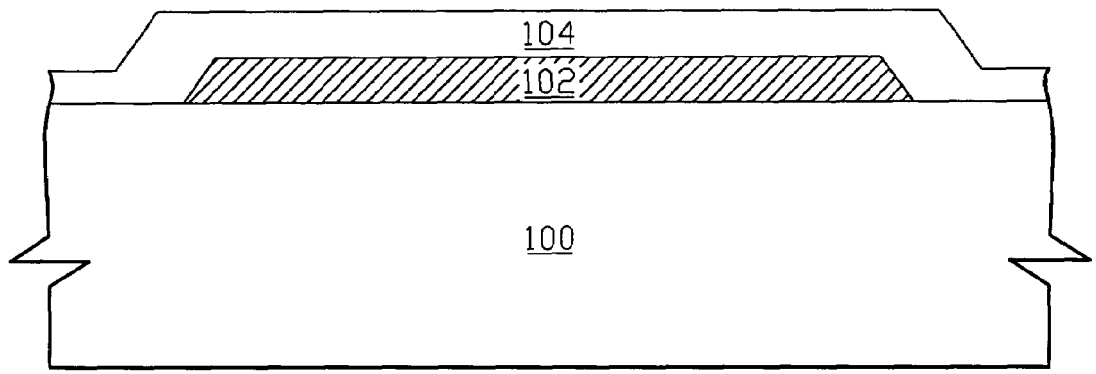
FIG. 1A shows a substrate having a dielectric layer and a conductive layer thereon.

Referring to FIG. 1A, a substrate 100 having a dielectric layer 104 and a conductive layer 102 thereon is shown. The substrate 100 comprises a transparent substrate such as quartz and glass. The conductive layer 102 comprises a metal layer and the metal layer preferably comprises an AlNdN alloy or an AlNd alloy. The conductive layer 102 is preferably formed by physical vapor deposition processes, especially a sputtering process. If an AlNdN alloy is used, the AlNdN alloy is formed on the substrate 100 by a sputtering process. By accelerating Argon ions to bombard an AlNd alloy sputtering target and introducing nitrogen into the sputtering chamber, the AlNdN alloy is formed on the substrate 100. If an AlNd alloy is used, the AlNd alloy is also formed on the substrate 100 by a sputtering process. By accelerating Argon ions to bombard an AlNd alloy sputtering target, the AlNd alloy is formed on the substrate 100. In order to form the pattern of the conductive layer 102 shown in FIG. 1A, photolithography and etching processes are performed. The dielectric layer 104 comprises a silicon nitride layer and the silicon nitride layer is preferably formed by plasma-enhanced chemical vapor deposition (PECVD) processes. The conductive layer 102 is used as a gate electrode of a thin-film transistor.

Figure 1B:
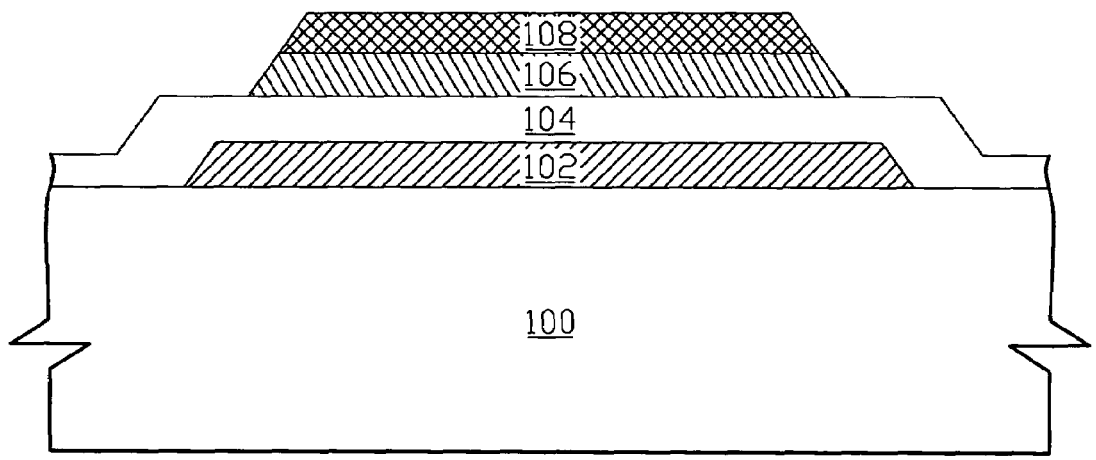
FIG. 1B shows a result of semiconductive layers sequentially formed on the dielectric layer in FIG. 1A.

Referring to FIG. 1B, semiconductive layers 106 and 108 are sequentially formed on the dielectric layer 104. The semiconductive layers 106 preferably comprises a hydrogenated amorphous silicon layer. The hydrogenated amorphous silicon layer is preferably formed by plasma-enhanced chemical vapor deposition (PECVD) processes. The semiconductive layers 108 comprises an N-type amorphous silicon layer and the N-type amorphous silicon layer is preferably formed by plasma-enhanced chemical vapor deposition (PECVD) processes. In order to form the pattern of the semiconductive layer 106 and 108 shown in FIG. 1B, photolithography and etching processes are performed.

Figure 1C:
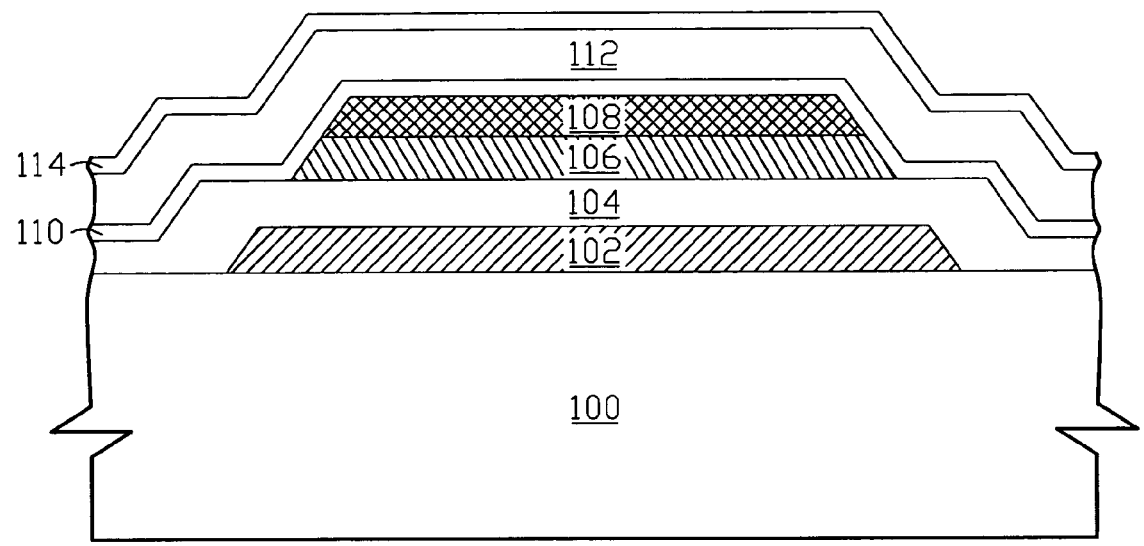
FIG. 1C shows a result of conductive layers sequentially formed on the structure shown in FIG. 1B.

Referring to FIG. 1C, conductive layers 110, 112 and 114 are sequentially formed on the structure shown in FIG. 1B. The conductive layer 110 comprises a metal layer and the metal layer preferably comprises an AlNdN alloy. The conductive layer 110 is preferably formed by physical vapor deposition processes, especially a sputtering process. If an AlNdN alloy is used, the AlNdN alloy is formed on the structure shown in FIG. 1B by a sputtering process. By accelerating Argon ions to bombard an AlNd alloy sputtering target and introducing nitrogen into the sputtering chamber, the AlNdN alloy is formed on the substrate 100. The thickness of the conductive layer 110 is preferably about 500 angstroms. The conductive layer 112 comprises a metal layer and the metal layer preferably comprises an AlNd alloy. The conductive layer 112 is preferably formed by physical vapor deposition processes, especially a sputtering process. If an AlNd alloy is used, the AlNd alloy is preferably formed by a sputtering process. The thickness of the conductive layer 112 is preferably about 2000 angstroms. The conductive layer 114 comprises a metal layer and the metal layer preferably comprises an AlNdN alloy. The conductive layer 114 is preferably formed by physical vapor deposition processes, especially a sputtering process. If an AlNdN alloy is used, the AlNdN alloy is preferably formed by a sputtering process. By accelerating Argon ions to bombard an AlNd alloy sputtering target and introducing nitrogen into the sputtering chamber, the AlNdN alloy is formed. The thickness of the conductive layer 114 is preferably about 500 angstroms. The conductive layer 112 is used as source and drain of a thin-film transistor and the conductive layer 110 is utilized as a buffer layer or a diffusion barrier layer to prevent the conductive layer 112 and the semiconductive layer 108 from interacting each other and diffusing into each other. The interaction and diffusion between the conductive layer 112 and the semiconductive layer 108 would induce a spiking effect and degrade the reliability of the thin-film transistor. The conductive layer 114 is used as a glue layer to protect the conductive layer 112 from being over-etched and prevent the electron migration phenomena of drain. The conductive layer 114 can also isolate the conductive layer 112 and a following formed transparent conductive film such as an ITO (Indium—Tin Oxide) film and prevent the conductive layer 112 and the transparent conductive film from interaction. Furthermore, the conductive layers 110, 112 and 114 can be formed by physical vapor deposition processes performed in the same process chamber.

Figure 1D:
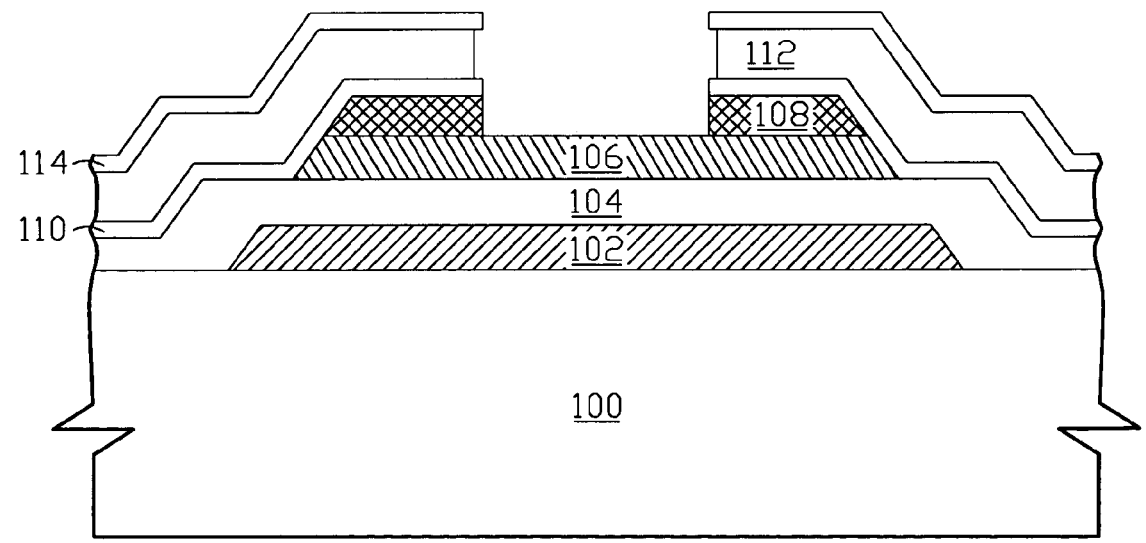
FIG. 1D shows a result of etching the conductive layers and the semiconductive layer to expose the semiconductive layer.

FIG. 1D shows a result of etching the conductive layers 110, 112, 114, and the semiconductive layer 106 to form an opening to expose the semiconductive layer 108 by conventional photolithography and etching processes. Comparing with conventional thin-film transistor source and drain structure and manufacturing method thereof, the invention uses an AlNdN/AlNd/AlNdN sandwich structure as source and drain of a thin-film transistor which has high reliability and low resistivity. The resistivity of AlNd alloy which is about 4μΩ is much less than the resistivity of Cr (18μΩ) so that RC time delay can be effectively reduced and the AlNdN/AlNd/AlNdN source and drain structure can be applied on large-size and high resolution LCDs and will meet the requirements of large-size and high resolution LCDs. Moreover, the process can be simplified and the cost thereof can be decreased since the gate electrode, the source and the drain are preferably AlNdN or AlNd alloys formed in the same process chamber.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claim is:

1. A thin-film transistor structure comprising:
   an insulating substrate;
   a gate electrode on said insulating substrate;
   a dielectric layer over said gate electrode;
   a first semiconductive layer on said dielectric layer;
   a second semiconductive layer on said first semiconductive layer;
   a first conductive layer on said second semiconductive layer;
   a second conductive layer on said first conductive layer, said second conductive layer is used as a source and a drain, said first conductive layer prevents said second conductive layer and said second semiconductive layer from diffusing into each other; and
   a third conductive layer on said second conductive layer, said third conductive layer is used as a glue layer and protects said second conductive layer from being over-etched, wherein said first, said second and said third conductive layers are made of alloy layers each having two same main metal components;
   wherein said second semiconductive layer, said first conductive layer, said second conductive layer and said third conductive layer have an opening therethrough and exposing said first semiconductive layer.

2. The thin-film transistor structure according to claim 1, wherein
   said gate electrode comprises an AlNd gate electrode.

3. The thin-film transistor structure according to claim 1, wherein
   said dielectric layer comprises a silicon nitride layer.

4. The thin-film transistor structure according to claim 1, wherein said first semiconductive layer comprises a hydrogenated amorphous silicon layer.

5. The thin-film transistor structure according to claim 1, wherein said second semiconductive layer comprises an N-type amorphous silicon layer.

6. The thin-film transistor structure according to claim 1, wherein said first conductive layer, said second conductive layer and said third conductive layer comprise a sandwich structure of AlNdN, AlNd and AlNdN alloys.

7. A thin-film transistor structure comprising:
an transparent insulating substrate;
a gate electrode on said transparent insulating substrate;
a dielectric layer over said gate electrode;
a first semiconductive layer on said dielectric layer;
a second semiconductive layer on said first semiconductive layer;
a first AlNdN alloy layer on said second semiconductive layer;
an AlNd alloy layer on said first AlNdN alloy layer, said AlNd alloy layer is used as a source and a drain; and
a second AlNdN layer on said AlNd alloy layer;
wherein said second semiconductive layer, said first AlNdN alloy layer, said AlNd alloy layer and said second AlNdN layer have an opening therethrough and exposing said first semiconductive layer.

8. The thin-film transistor structure according to claim 7, wherein said first AlNdN alloy layer has a thickness of about 500 angstroms.

9. The thin-film transistor structure according to claim 7, wherein said AlNd alloy layer has a thickness of about 2000 angstroms.

10. The thin-film transistor structure according to claim 7, wherein said second AlNdN alloy layer has a thickness of about 500 angstroms.

11. A thin-film transistor structure comprising:
an insulating substrate;
a gate electrode on said insulating substrate;
a dielectric layer over said gate electrode;
a hydrogenated amorphous silicon layer on said dielectric layer;
an amorphous silicon layer on said hydrogenated amorphous silicon layer;
a first conductive layer on said amorphous silicon layer;
an AlNd alloy layer on said first conductive layer, said AlNd alloy layer is used as a source and a drain; and
a second conductive layer on said AlNd alloy layer, said second conductive layer is used as a glue layer and to protects said AlNd alloy layer from being over-etched, wherein said first and said second conductive layers are made of aluminum-based alloy layers.

12. The thin-film transistor structure according to claim 11, wherein said first conductive layer prevents said AlNd alloy layer and said amorphous silicon layer from diffusing into each other.

13. The thin-film transistor structure according to claim 11, wherein said first conductive layer and said second conductive layer comprise AlNdN alloy layers.

* * * * *